United States Patent [19]
LoIacono et al.

[11] Patent Number: 5,210,071
[45] Date of Patent: May 11, 1993

[54] METHOD OF FORMING SUPERCONDUCTIVE ARTICLES BY HYDROSTATIC EXTRUSION

[75] Inventors: Dominic N. LoIacono, Franklin Lakes; John T. Plewes, Madison, both of N.J.

[73] Assignee: AT&T Bell Laboratories, Murray Hill, N.J.

[21] Appl. No.: 845,511

[22] Filed: Feb. 27, 1992

Related U.S. Application Data

[63] Continuation of Ser. No. 620,975, Nov. 30, 1990, abandoned.

[51] Int. Cl.$^5$ ............... H01L 39/12; B29C 43/10
[52] U.S. Cl. .................... 505/1; 264/570; 505/739; 505/740
[58] Field of Search ......... 264/60, 61; 505/1, 739, 505/740, 780, 785; 29/599

[56] References Cited

PUBLICATIONS

Ishida, "Manufacture of Wire or Rod for Superconductor" Patent Abstracts of Japan 63-291316.
Advances in Superconducting, Proc. 1st. Int. Symp. on Superconducting, 1989, "Fabrication and Characterization of Ceramic Superconducting Composite Wire," by M. R. Notis et al., pp. 371-375.
J. Am. Ceram. Soc. 72, 1989, "Fabrication and Microstructure of Composite Metal-Clad Ceramic Superconducting Wire," by M-S Oh et al., pp. 2142-2147.
Annals of the CIRP 37, No. 1, 1988, "Manufacturing of High $T_c$ Superconducting Ceramic Wires by Hot Extrusion," by S. K. Samanta et al., pp. 259-261.
Processing and Applications of High $T_c$ Superconductors, W. E. Mayo. ed., The Mettalugical Society 1988, "Deformation Processing of High $T_c$ Superconducting Wire," by C. R. N. Wright, et al. pp. 139-150.
Physica C 165, 1990, "Texture Processing of Extruded $YBa_2CU_3O_{6+x}$ Wire by Zone Melting," by P. J. McGinn et al., pp. 480-484.
Physica C 167, 1990, "Zone Melt Texturing of $YBa_2CU_3O_{6+x}$ With Silver Additions," by P. J. McGinn et al., pp. 343-347.
J. Mat. Sci. Lett. 9, 1990, "A Phenomenological Model on the Deformation Mechanism of $YBa_2CU_3O_{7-x} + Ag_2O$ Composite," by S. Samajdar et al., pp. 137-140.
J. Appl. Phys. 66, 1989, "A Novel Processing Technique for Fabrication of Flexible $YBa_2CU_3O_{7-x}$ Wire," by S. K. Samanta et al., pp. 4532-4534.
Advanced Ceramic Materials, vol. 2, No. 3-B, 1987, "Fabrication of Ceramic Articles from High $T_c$ Superconducting Oxides," by D. W. Johnson, et al., p. 364.

Primary Examiner—Jan H. Silbaugh
Assistant Examiner—Christopher A. Fiorilla
Attorney, Agent, or Firm—M. I. Finston; E. E. Pacher

[57] ABSTRACT

A method for forming elongated articles including metallic oxide superconductor material by hydrostatic extrusion at temperatures less than about 800° C., and even at temperatures less than about 450° C. The method includes providing superconductive core material that is substantially free of carbon or organic additives and that has an equivalent density at least about 55% of full density, and enclosing the densified material in a metal container, to become a cladding, prior to extrusion. In a preferred embodiment, the cladding material is a dispersion hardened metal or metal alloy.

15 Claims, 4 Drawing Sheets

METHOD OF FORMING SUPERCONDUCTIVE ARTICLES BY HYDROSTATIC EXTRUSION

This application is a continuation of our application Ser. No. 07/620,975 filed Nov. 30, 1990 now abandoned.

FIELD OF THE INVENTION

The invention relates to the field of methods for the production of bodies comprising metallic oxide superconductor material.

ART BACKGROUND

Many potential applications have emerged for metallic oxide superconductors that exhibit superconductivity at relatively high temperatures, e.g., temperatures that can be maintained via liquid nitrogen cooling. For many such applications, e.g., applications involving the production, distribution, and utilization of electric power, it is desirable to provide superconductive bodies having elongated shapes, for example wires or rods comprising metallic oxide superconductor material.

A number of investigators have attempted to use wire-drawing or extrusion techniques to produce rods or wires comprising metallic oxide superconductor material. For example, M. R. Notis, et al., "Fabrication and Characterization of Ceramic Superconducting Composite Wire," in *Advances in Superconductivity*, Proc. 1st Int. Symp. on Superconductivity (1989) pp. 371–375, and M-S Oh, et al., "Fabrication and Microstructure of Composite Metal-Clad Ceramic Superconducting Wire," *J. Am. Ceram. Soc.* 72 (1989) pp. 2142–2147, have reported the use of wire drawing to achieve areal reduction ratios (also referred to as "extrusion ratios") up to about 1.4 for $Ba_2YCu_3O_7$ cores surrounded by silver claddings or composite claddings of silver and stainless steel. These authors also suggested, without providing any guidance, that hydrostatic extrusion may be used as an alternative method to wire drawing. For many applications, however, it is desirable to achieve extrusion ratios greater than 1.4. Moreover, these authors observed displacement reactions occurring between the core material and the cladding material. Such reactions are undesirable because they may degrade the performance of the superconductive core.

Other investigators have employed extrusion techniques. For example, S. K. Samanta, et al., "Manufacturing of High $T_c$ Superconducting Ceramic Wires by Hot Extrusion," *Annals of the CIRP* 37 No. 1 (1988) pp. 259–261, reported an extrusion ratio of 9 achieved by means of conventional (i.e., non-hydrostatic) extrusion of metal-clad powder at temperatures of 825° C. and 895° C. R. N. Wright, et al., "Deformation Processing of High $T_c$ Superconducting Wire," in *Processing and Applications of High $T_c$ Superconductors*, W. E. Mayo, ed., The Metallurgical Society (1988) pp. 139–150, reported extrusion of metal-clad powder at even higher extrusion ratios of 15 at an extrusion temperature of 850° C. However, extrusion at temperatures substantially greater than about 800° C., and even at temperatures substantially greater than about 450° C., is not generally desirable because, inter alia, at least some commonly used hydrostatic fluids for pressure distribution during hydrostatic extrusion are difficult or impossible to use at such temperatures.

Investigators have also sought to achieve relatively high extrusion ratios at relatively low extrusion temperatures. P. J. McGinn, et al., "Texture Processing of Extruded $YBa_2Cu_3O_{6+x}$ Wires by Zone Melting," *Physica C* 165 (1990) pp. 480–484, and P. J. McGinn, et al., "Zone Melt Texturing of $YBa_2Cu_3O_{6+x}$ with Silver Additions," *Physica C* 167 (1990) pp. 343–347, reported cold extrusion of powdered $Ba_2YCu_3O_7$ material mixed with organic solvent, binder, dispersant, and plasticizer. However, it is generally believed that the organic materials must be removed from the core in order to achieve a useful superconductive article. Thus, for example, R. N. Wright, et al., cited above, reported achieving extrusion ratios of 10, and even of 70, by cold extrusion of core material comprising 55 vol. % superconductor powder and 45 vol. % polyethylene spheres. It was observed that the extrudate was not electrically continuous, but could be made superconducting by extracting the polyethylene. However, carbon-containing residues are believed capable of degrading the superconductive properties of the core material. Moreover, removal of the polyethylene involves heating an unencapsulated core. As an unintended side effect, it is possible for the stoichiometry of the core material to be changed, for example by oxygen evolution. As a consequence, extrusion techniques that involve organic additives may be unacceptable for at least some applications.

Still other investigators have attempted warm extrusion without organic additives. S. Samajdar, et al., "A Phenomenological Model On The Deformation Mechanism Of $YBa_2Cu_3O_{7-x}+Ag_2O$ Composite," *J. Mat. Sci. Lett.* 9 (1990) pp. 137–140, and S. K. Samanta, et al., "A Novel Processing Technique For Fabrication of Flexible $YBa_2Cu_3O_{7-x}$ Wire," *J. Appl. Phys.* 66 (1989) pp. 4532–4534, have reported extrusion, at 450° C., of $Ba_2YCu_3O_7$ powder containing 50–70 vol. % silver oxide ($Ag_2O$). An extrusion ratio of 9 was reportedly achieved. However, the presence of substantial quantities of non-superconductive material in the core may limit the critical current density of the (superconducting) core, and may even threaten the electrical continuity of the core. Thus it is desirable to have a core containing less than about 30 vol. % non-superconductive material.

Thus, investigators have sought, hitherto without success, a method for extrusively forming, at temperatures below about 800° C., and especially at temperatures below about 450° C. (exclusive of adiabatic heating during extrusion), elongated bodies that comprise metallic oxide superconductor material that is substantially free of organic additives, and is diluted by less than about 30 vol. % non-superconductor material. Investigators have also sought, hitherto without success, an extrusive method for forming, at such relatively low temperatures, bodies that are substantially free of elemental carbon or organic additives, and that have experienced an extrusion ratio greater than about nine.

SUMMARY OF THE INVENTION

In a broad sense, the invention is a method for making a superconducting article comprising metallic oxide superconductor material by hydrostatic extrusion. Core material, which comprises the metallic oxide superconductor material, is provided in the form of at least one slug or pellet. Significantly, no elemental carbon or organic additive, e.g., organic binder or organic plasticizer, is added to the core material. Preferably, the core material includes less than 30 vol. % inorganic, non-superconductor material. The slug (or pellets) is enclosed within a hollow cylinder comprising a cladding material. (The assembled cylinder and slug are collectively referred to as the "billet".) Significantly, the equivalent density of the pellets or slug, just prior to assembly of the billet, should be at least about 55% of the full (i.e., fused) density of the metallic oxide superconductor. (By "equivalent density" is meant that portion of the density that is attributable to the metallic oxide superconductor. Where the core material contains metallic oxide superconductor having a volume fraction $v_{ox}$ and also contains one or more additives having densities $d_1$, $d_2$, etc. and respective volume fractions $v_1$, $v_2$, etc., the equivalent density $d_{equiv}$ is determined from the actual density D according to the formula $D = v_{ox} d_{equiv} + v_1 d_1 + v_2 d_2 + \ldots$ ) The billet is heated to a temperature less than about 800° C. and, preferably, less than about 450° C., and hydrostatically compressed such that a composite extrudate, comprising core material surrounded by cladding material, is produced.

In one embodiment of the invention, the core material may initially be provided in powder form. The initial core material powder may be formed into a slug or pellets by, e.g., isostatic compression followed by sintering.

In a preferred embodiment, the cladding material comprises a dispersion strengthened metal or a dispersion strengthened metal alloy.

Finely dispersed silver is optionally added to the metallic oxide superconductor material for the purpose, e.g., of improving the extrusion characteristics of the superconductor material. (As noted, the total amount of silver added is preferably less than 30 vol. % of the core material.) Thus in one aspect, the invention further involves a combination of steps for adding finely dispersed silver to the oxide superconductor material while it is still in the initial powdered form. Such steps include: mixing powdered oxide superconductor with powdered silver oxide, ball milling the mixture in an appropriate solvent, exemplarily methylene chloride, such that a slurry is formed, vacuum filtering the slurry such that a filtrate is retained, drying the filtrate such that dry cake is formed, and heating the dry cake for about two hours at about 400° C.

DETAILED DESCRIPTION

In a preferred embodiment, the core material consists of metallic oxide superconductor material (here referred to as "oxide superconductor") to which finely dispersed silver is optionally added. The total fraction of core material that is not metallic oxide superconductor material is preferably less than 30 vol. %. Moreover, the core material should be substantially free of elemental carbon or organic materials. It is believed that any metallic oxide superconductor material can be used. An exemplary, specific metallic oxide superconductor material is $Ba_2YCu_3O_7$. For illustrative purposes, the following process steps are described with reference to this particular oxide superconductor compound.

Figure 1:
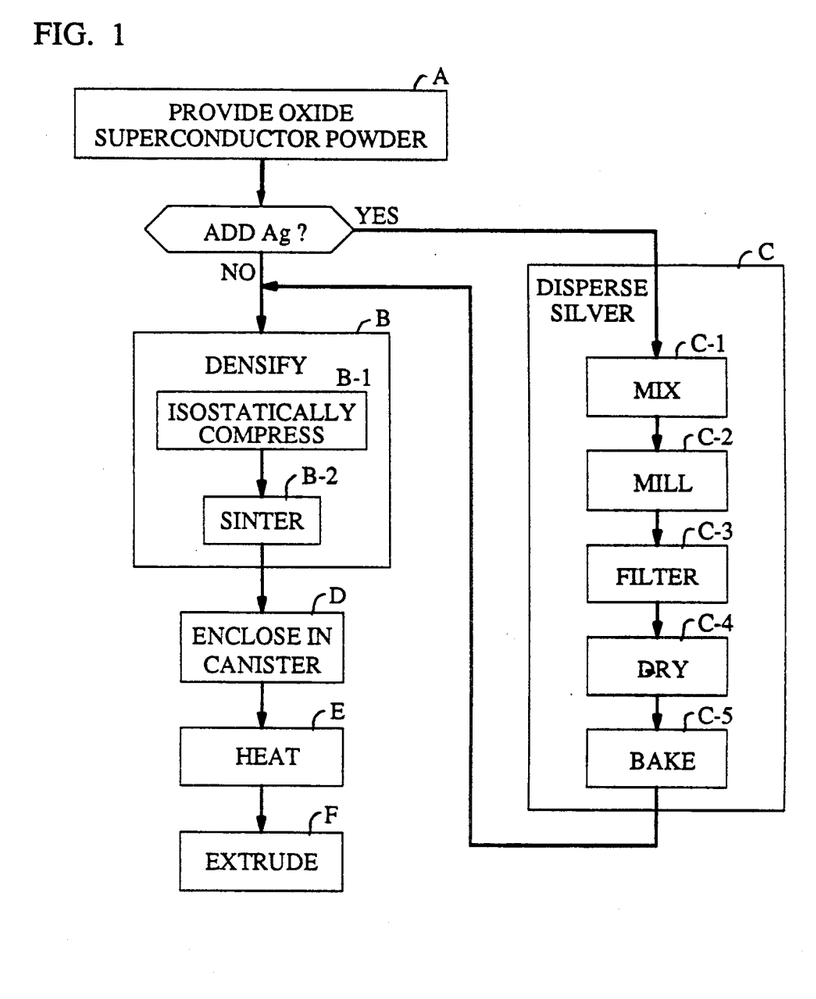
FIG. 1 is a flowchart depicting the steps of the inventive method in one embodiment.

With reference to FIG. 1, the oxide superconductor is initially provided (step A) in the form of a powder, having an average grain size of, e.g., 10–100 $\mu$m. Methods for producing an appropriate powder are well known in the art. An exemplary method is described in D. W. Johnson, et al., "Fabrication of Ceramic Articles from High $T_c$ Superconducting Oxides," *Advanced Ceramic Materials*, vol. 2, No. 3-B (1987) p. 364. At various stages of the processing to be described below, the oxide superconductor is characterized, inter alia, by its density (or equivalent density, discussed above). The density is expressed here as a relative density, i.e., as a percentage of a reference density corresponding to the density of fused oxide superconductor as measured by the method of Archimedes. The reference density (also referred to as "full density") of $Ba_2YCu_3O_7$ was determined to be 6.2 g/cm$^2$. (However, it should be noted that small variations are generally expected between density measurements made by different investigators, using different equipment, of the same fused oxide superconductor. As a consequence, absolute determinations of the reference density are expected to vary somewhat between laboratories.)

Prior to extrusion, the core material is formed (step B) into partially densified pellets, or, preferably, a partially densified slug, by, e.g., isostatic compression (B1) followed, e.g., by sintering (B2). Densification by, e.g., sintering is necessary because if the equivalent density of the core material is less than about 55%, the walls of the canister will tend to collapse against the (relatively compressible) core material during extrusion, resulting in accordion-like corrugations in the cladding. After isostatic compression alone, the equivalent density of the pellets is typically about 30%–35%. Sintering typically raises this density to about 55%–65%. Although hot isostatic compression is preferred because a higher green density can be achieved thereby, cold isostatic compression is readily employed. After the pellets or slug are prepared, they are loaded (step D) into a bore hole drilled in a metal canister. The diameter of the pellets or slug is slightly smaller than the diameter of the bore hole, and is typically 0.3 inches (0.76 cm). The length of the canister, and concomitantly of the bore hole that is filled with core material, is typically 4 inches (10.16 cm) (depending on the size of the extrusion press). Thus, the slug, if used, is typically 4 inches (10.16 cm) long. Pellets, if used, are typically made about 0.5 inches (1.27 cm) thick. The loaded canister is subsequently heated (step E) and extruded (step F).

Figure 2:
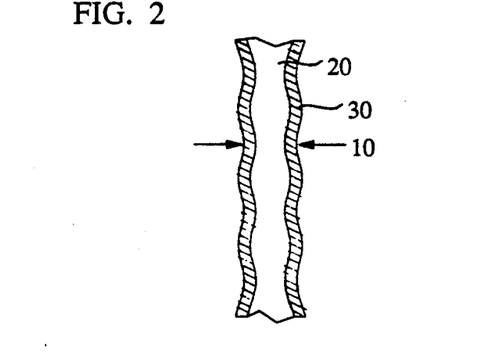
FIG. 2 is a schematic drawing, not to scale, of the potential results of an instability that may occur during extrusion.

With reference to FIG. 2, it should be noted in this regard that if pellets are used, the interfaces between the stacked pellets in the canister may give rise to a spatial instability during extrusion. The effect of this instability is to create constrictions 10 in the extruded core 20 at irregular intervals. In some cases, the constrictions may also appear in the outer surface of the extruded jacket 30. As a consequence, the core (and possibly also the jacket) may assume a wavy, or sausage-like, appearance. For this reason, inter alia, the use of an integral slug is preferred. However, it has been discovered that the instability can be mitigated, and even eliminated, by adding finely divided silver (step C of FIG. 1) to the core material, as noted above and discussed in greater detail below. Moreover, the instability is dependent on the die angle. That is, certain samples were observed to exhibit instability when extruded at a die angle of 60°. However, when identical samples were extruded at a die angle of 75°, the instability was less apparent, and at a die angle of 90°, it was undetectable, at least to the unaided eye.

In an exemplary procedure for making pellets or slugs, core material is first provided, typically having a grain size ranging from about 10 $\mu$m to about 100 $\mu$m. (The grain size is not critical.) The core material is placed in a mold for isostatic compression and pressed into pellets at a pressure, typically, of 50 ksi (345 MPa). Isostatic compression may be at room temperature or at elevated temperatures that are readily apparent to practitioners in the art. The pellets or slugs are then sintered in an oxygen atmosphere in order to further densify them and to achieve optimal oxygen stoichiometry. As noted, further densification is desirable in order to avoid corrugating the cladding. The oxygen stoichiometry is important because at relatively high temperatures, e.g. above about 450° C. for $Ba_2YCu_3O_7$, metallic oxide superconductors tend to evolve oxygen, and as a consequence the stoichiometric coefficient of oxygen remaining behind in the oxide falls below its nominal value. When this occurs, the superconductive electronic properties of the material may be impaired. The presence of an oxygen atmosphere during sintering tends to shift the thermodynamic equilibrium such that oxygen evolution is less favored. The pellets or slugs are sintered for about 24 hours at about 930° C., and then cooled to room temperature at a constant rate for about 48 hours. As noted, such a sintering process typically increases the equivalent density of the core material to about 55%–65%.

In a currently preferred process for preparing the oxide superconductor material and forming it into, e.g., slugs, finely divided silver is mixed into the core material. It has been discovered that the addition of silver mitigates or eliminates the spatial instability discussed above. Moreover, it has been discovered that the addition of silver may reduce the pressure required to achieve a given extrusion ratio.

When silver is added in a conventional manner, it tends to segregate out, forming clumps or granules, during sintering of the slug. Thus, a currently preferred embodiment includes a sequence of steps that are effective for dispersing silver in the initial metallic oxide powder while avoiding such segregation and maintaining a uniform distribution of silver during sintering.

The first steps are mixing (step C1 of FIG. 1) and milling (step C2), using, e.g., methylene chloride (also called dichloromethane, formula $CH_2Cl_2$) as the milling solvent. A quantity of powdered oxide superconductor, e.g., 100 g of $Ba_2YCu_3O_7$, is mixed with a quantity, e.g., 70 g, of silver oxide ($Ag_2O$) in a neoprene bottle having a total capacity of, e.g., 500 ml. Methylene chloride is added until the bottle is filled to 75% of capacity. Large zirconium oxide balls, for milling, are then added until the bottle is filled to capacity. The bottle is then agitated on a horizontal roller at 60 rpm for 4 hours. The resulting slurry is removed from the bottle and vacuum filtered (C3), and the resulting cake is baked for about 12 hours in a vacuum oven at 60° C. to dry it (C4). The dried cake is placed in a zirconia boat and heated in a tube furnace for two hours at 400° C. (step C5). The resulting material is then isostatically compressed and sintered as described above. It has been found that this treatment produces a dispersion of silver particles averaging 1–2.5 $\mu$m in size before sintering, and 3–5 $\mu$m in size after sintering for 16 hours at 925° C., followed by furnace cooling in oxygen. It has also been found that the equivalent density of the material before sintering is about 30%–35%, and after sintering it is about 55%–65%. The corresponding extrudate has been found to have an equivalent density of about 92%–96%.

Figure 3:
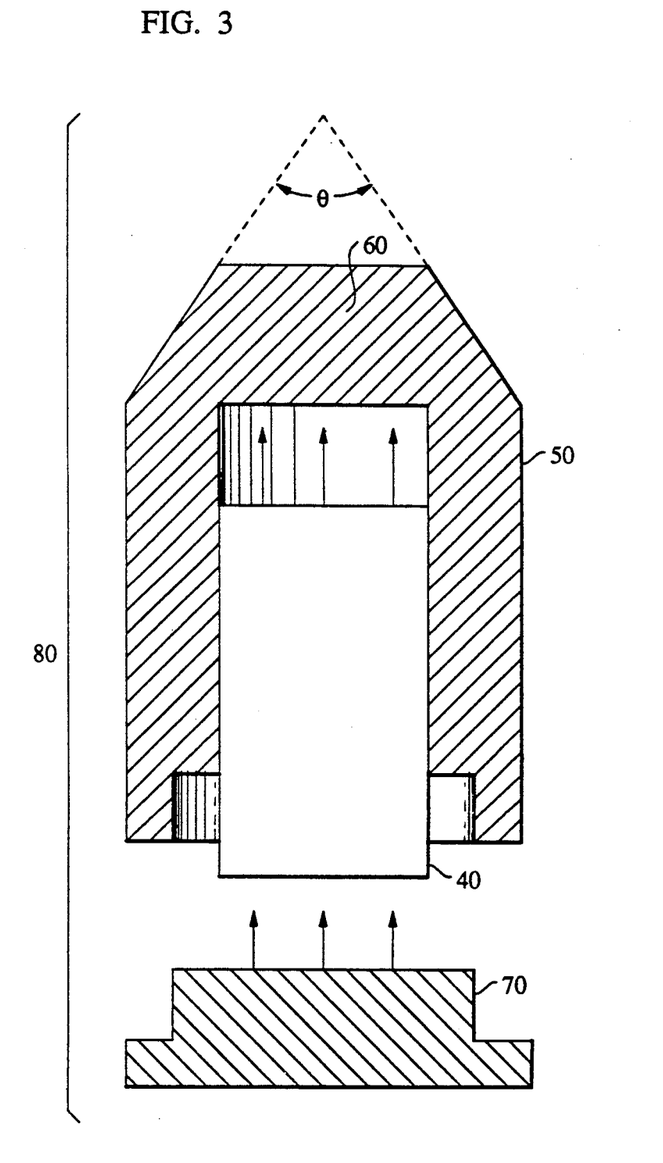
FIG. 3 is a schematic drawing, not to scale, of a billet comprising a canister, a slug of core material, and a cover.

With reference to FIG. 3, after sintering, the slug 40 is enclosed within a canister 50. The canister is exemplarily formed by drilling and machining a solid metal cylinder. (The metal of the cylinder is here referred to as the "cladding metal.") The cladding metal should be relatively ductile, such that it can be extruded to form the cladding of the extrudate, at the desired extrusion ratios, without suffering fractures or tears. Moreover, the cladding metal should be capable of flowing relatively smoothly through the die during extrusion, without sticking to the inner die surface and stalling the extrusion press. Still further, the cladding metal should have a relatively high thermal conductivity in order to readily distribute heat generated by adiabatic heating during extrusion.

In at least some cases, it may also be necessary to select a cladding metal that is chemically compatible with the superconductor material. That is, certain chemical elements, including copper and nickel, are capable of chemically reacting with metallic oxide superconductors with the result that the desirable superconductive electrical properties of the metallic oxide superconductors are degraded or eliminated. This may present a problem because the extrusion process often impairs the same desirable electrical properties, and the extrudate is typically annealed to restore those properties. If incompatible elements are present in the cladding, chemical reactions that poison the superconductor may take place during annealing. Thus, cladding materials are preferable that are relatively free of such incompatible elements. However, it should be noted in this regard that a cladding that contains incompatible elements is readily stripped away, prior to annealing, by conventional processes such as acid etching. (One appropriate acid solvent for this purpose is a 50% solution of nitric acid in water. It has been observed that this solvent can be used without a significant deleterious effect on the core material.) Thus, chemical incompatibility is less important when, for example, the extruded core is intended to be used without a cladding.

It has further been observed that if the cladding material is too soft, it may not form an acceptable cladding. For example, some materials, such as pure silver, tend to flow away from the advancing front end of the extrudate during extrusion. As a result, the core, bare of any cladding, may advance a relatively short distance and then break. Moreover, this flow behavior tends to remove cladding metal from around the core material as it is being extruded. As a consequence, the cross sectional area of the core is reduced by a smaller factor than would be expected by simply comparing the cladding outer diameter before and after extrusion. In order to produce articles having an optimal extrusion ratio, and especially in order to produce articles having extrusion ratios greater than about 15, it is desirable to manufacture the canister from a hardened material.

It has been found that dispersion hardened metals or dispersion hardened metal alloys are especially useful as cladding materials. (A dispersion hardened metal is one that is hardened by dispersing insoluble solid particles within the metal.) Dispersion hardened metals are generally better for this purpose than metals hardened by other processes, e.g., by forming solid solutions, because at elevated temperatures, they exhibit higher strain-hardening rates. This is an important property because extrusion is typically carried out at a temperature of 600° F., (316° C.) and adiabatic heating may raise the temperature during extrusion by as much as about 400° F. (204° C.). Moreover, it has been found that it is necessary to use a dispersion hardened cladding material in order to attain extrusion ratios greater than about 30.

A preferred cladding material is silver that is dispersion hardened with cadmium oxide at a concentration of, e.g., 10 mole %. This material is preferred because it is chemically compatible with many, if not all, currently known metallic oxide superconductors.

Other exemplary cladding materials are silver that is dispersion hardened with nickel at a concentration of 10 mole %, and dispersion strengthened copper. Exemplary formulations of dispersion strengthened copper that are useful as cladding materials are the alumina-dispersed copper formulations going under the Copper Development Association designations C15715 (0.3 Wt. % alumina) and C15760 (1.1 Wt. % alumina). These formulations are commercially available as GlidCop, a registered trademark of SCM Metal Products, Inc., of Cleveland, Ohio.

As noted, the canister is exemplarily made by drilling and machining a solid metal cylinder. The outer diameter of the canister depends on the chamber size of the extrusion press to be used. On an exemplary press, the chamber has an inside diameter of 0.625 inches (1.59 cm), and a corresponding canister should have an outside diameter of about 0.620 inches (1.57 cm). The corresponding bore hole diameter in the canister ranges, typically, from about 0.250 inches (0.635 cm) to about 0.435 inches (1.10 cm). The slug or pellets fit within the bore hole with a clearance of no more than about 10 mils (0.254 mm) relative to the inner walls of the canister.

The closed end of the canister is desirably formed into a conical taper 60, exemplarily by machining. (Alternatively, the taper may be a separate piece that is soldered onto the end of the canister.) The taper may end bluntly, or it may optionally converge to a point. The full vertex angle $\theta$ of the cone is substantially the same as the extrusion angle (which is determined by the selection of the die to be used). The borehole preferably does not extend into the taper region.

After the core material has been loaded into the bore hole, the open end of the canister is closed with an end cover 70. The end cover is typically made of the cladding material, and comprises at least one disk-shaped portion having an outer diameter equal to that of the canister. For example, a currently preferred end cover has a T-shaped cross section, such that a lower portion comprising a disk of relatively small diameter can be inserted in a plug-like manner into the open end of the canister, while an upper portion, comprising a disk of greater diameter, presses against, and is sealed to, the canister material. The cover is initially assembled on the canister by press fitting, and a final seal is made by compression in the extrusion press. Various alternative cover designs can readily be used, such as a disk of uniform outer diameter that is compression sealed to the canister, or a cover that is both T-shaped and threaded, and that is screwed into place. The fully assembled canister 80, including the slug and the cover, is here referred to as a "billet."

Figure 4:
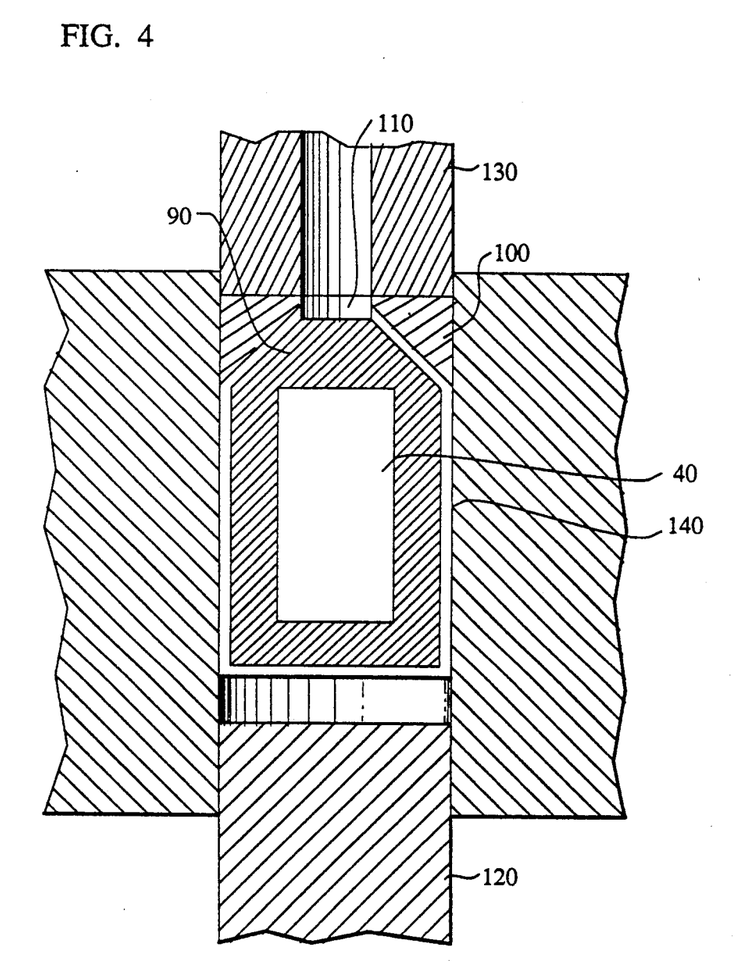
FIG. 4 is a schematic drawing, not to scale, of a billet assembled in an extrusion press.

With reference to FIG. 4, when the billet 80 is assembled within a typical extrusion press preparatory to extrusion, the closed end 90 of the canister is situated adjacent to a die 100 having an inward-facing bevel that is tapered at the so-called die angle. The bevel surrounds an aperture 110 through which the extrudate emerges during extrusion.

The die angle has been found to affect the extrusion process. That is, die angles ranging from about 60° to about 90° may be usefully employed. However, as noted above, when the core material is in pellet form it is desirable to use a die angle of at least about 75°. Moreover, it has been observed that when the core material is in the form of an integral slug, the highest extrusion ratios are achieved at a given pressure when the die angle is about 70°–75°, and thus, in at least this case, a die angle of about 70°–75° is preferred.

Devices for hydrostatic extrusion are well known in the art. An exemplary hydrostatic extrusion apparatus that is commercially available is the 0.625-inch (1.59 cm) bore, 4-inch (10.16 cm) length, hydrostatic extrusion facility manufactured by Naples Research and Manufacturing Company of Naples, Fla. This apparatus is designed to reach a maximum hydrostatic pressure of 325,000 psi (2240 MPa), and it can be electrically heated to about 316° C. by an electrical heating coil surrounding the chamber. The hydrostatic fluid used is a silicone oil sold by Amoco under the tradename Synthalube, and also sold by Naples Research and Development under the tradename JCT Extroil 111. The chamber has adequate heat resistance up to 316° C.–371° C. The die 100 is made of tool steel, and the ram 120 and die stem 130 are made of tungsten carbide. The use of such an extrusion press is well known to those skilled in the art, and is described only briefly here.

Prior to insertion of the billet, a small quantity of the hydrostatic fluid 140 is placed within the (preheated) chamber such that during extrusion, the billet will be substantially surrounded by the fluid and as a result will be subjected to hydrostatic or quasi-hydrostatic pressure. In order to leave room for the hydrostatic fluid, the diameter of the billet is smaller than the diameter of the chamber by at least about 5 mils (0.127 mm), but not more than about 15–20 mils (0.381–0.508 mm).

In a preferred sequence of steps, the slug (or, alternatively, a stack of pellets) is first assembled in the canister. The cover of the canister is then press fit or screwed over the open end of the canister. As noted, the loaded canister is referred to here as the billet. The billet and the empty chamber are separately preheated to the extrusion temperature. Hydrostatic fluid is placed within the chamber, as noted, above. The preheated billet is then placed within the chamber, and the die is placed over the billet. The ram is then advanced until the die engages the die stem and is properly aligned and set over the taper of the canister. A short period of time, typically about 30 seconds, is allowed for temperature equilibration before extrusion commences. Extrusion is commenced by advancing the ram of the extrusion press against the die stem. Typical strain rates are 0.08–0.2 inches/second (0.2–0.5 cm/second). It should be noted in this regard that adiabatic heating is more pronounced when higher strain rates are used.

The extrusion temperature is typically about 316° C., is preferably less than about 800° C., and is still more preferably less than about 450° C., as explained below. (These temperatures do not include the additional temperature increment due to adiabatic heating during extrusion.) It has been observed that heating even to such relatively low temperatures results in a dramatic, and quite surprising, reduction in the pressures required to achieve extrusion.

It is desirable to avoid heating the billet, at least prior to extrusion, above the useful temperature range of the hydrostatic material. Such ranges are typically below about 500° C., and in the case of Synthalube, referred to above, the manufacturer's recommended range is below about 350° C. Furthermore, at sufficiently high temperatures, for example above about 450° C. for $Ba_2YCu_3O_7$, oxygen tends to be evolved from the metallic oxide. This may tend not only to impair the superconductive electrical properties of the core, but may also interfere with the extrusion process. Although such temperatures are typically not reached by electrical heating alone, such temperatures may be reached by a combination of electrical heating (via the heating coils) and adiabatic heating of the extrudate during extrusion. Thus, another reason to restrict electrical heating of the billet to temperatures below about 500° C. (and preferably below about 450° C.) is to avoid chemical decomposition of the core material at temperatures reached by the added-on effects of adiabatic heating. However, it should be noted in this regard that the core material is sealed within a canister that is substantially non-reactive toward oxygen at the process temperatures and pressures, and the core material is substantially free of readily oxidizable impurities, e.g., organic plasticizers or binders. As a result, most of the oxygen that may be evolved is confined within the canister.

Figure 5:
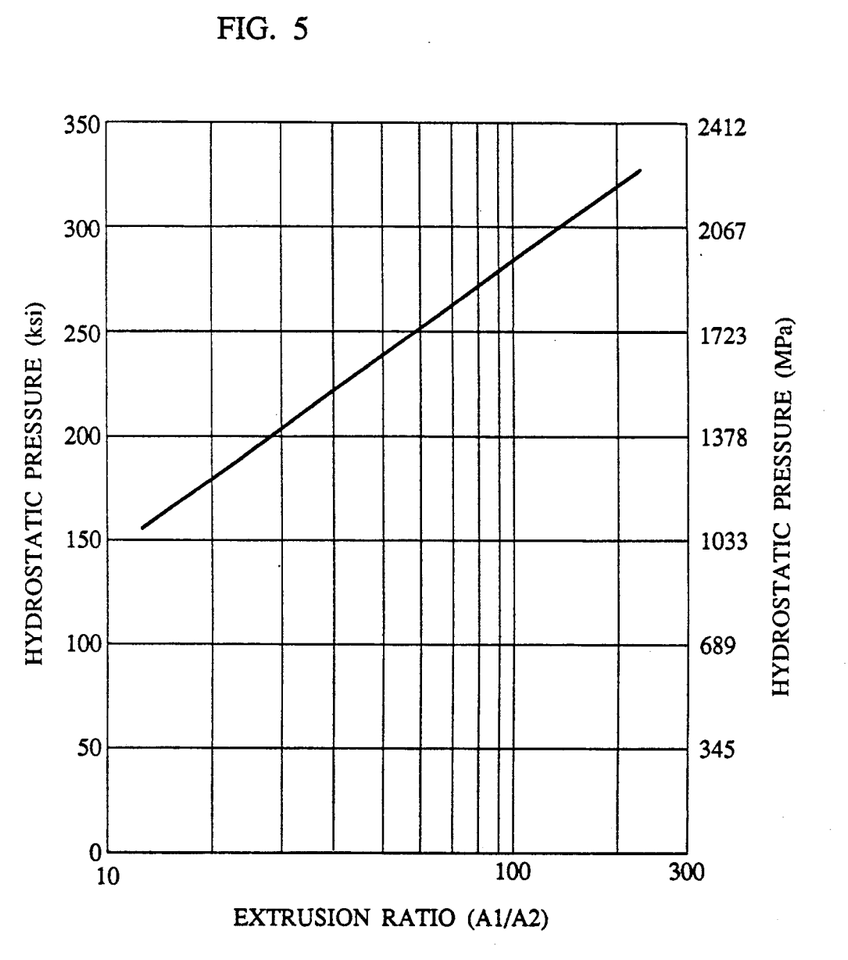
FIG. 5 is a graph of the relation between pressure and extrusion ratio for an illustrative series of extrusion runs.

After the billet has been electrically heated to a predetermined, appropriate temperature, extrusion is initiated. For extrusion ratios in the range 10-100, pressures in the range 100-350 ksi (690-2410 MPa) are generally required. (FIG. 5 shows the relationship between pressure and extrusion ratio for an illustrative series of extrusions.) The maximum pressure that can be used is limited by the design of the extrusion press to be used. Extrusion ratios greater than 4, and, in fact, ranging up to 100 and even more, are readily achieved by this method.

After extrusion, the superconductor material of the core may be so flawed by shear strain that it is no longer superconductive. However, superconductivity is readily restored by annealing. By way of example, superconductivity in $Ba_2YCu_3O_7$ is readily restored by heating for 2-5 hours at 925° C., followed by cooling to room temperature at a rate of about 10° C./hour. As noted above in connection with heating during extrusion, the core material is sealed within a cladding that is substantially non-reactive toward oxygen at the process temperatures and pressures, and the core material is substantially free of readily oxidizable impurities, e.g., organic plasticizers or binders. As a result, most of the oxygen that may be evolved during annealing after extrusion is confined within the core.

It should be noted that if the cladding contains incompatible elements such as copper or nickel, the annealing conditions may also promote chemical poisoning of the superconductor. Thus, for example, poisoning of $Ba_2YCu_3O_7$ by copper may begin at temperatures as low as about 700° C., at which copper acquires significant diffusive mobility. Such poisoning is readily avoided by stripping away the cladding prior to annealing.

EXAMPLE

A slug of $Ba_2YCu_3O_7$ containing 28 vol. % dispersed silver was prepared by the method described above. The slug was 0.325 inches (0.826 cm) in diameter. The slug was loaded into a canister of silver that was dispersion hardened with 10 mole % cadmium oxide. The canister was of one piece, including a pointed taper machined at the die angle of 70°. Using a die with a circular aperture and a pressure of about 1890 MPa, an extrusion ratio of 100 was achieved. No obvious porosity was observed on subsequent metallographic examination of the extruded core material.

We claim:

1. A method for making a superconducting article, comprising the steps of:
   a) providing a hollow cylinder comprising cladding material;
   b) providing core material comprising metallic oxide superconductor material, the metallic oxide superconductor material being characterized by a fused density;
   c) enclosing the core material within the cylinder; and
   d) elongating the cylinder and core material such that a first cross sectional area is associated with the core material just prior to the elongating step, a second cross sectional area is associated with the core material after the elongating step, and the first cross sectional area is greater than the second cross sectional area, characterized in that
   e) the core material is substantially free of organic materials and elemental carbon;
   f) the elongating step comprises hydrostatically extruding the cylinder and the core material such that a composite extrudate, comprising core material and cladding metal, is produced, and the first cross sectional area is at least 30 times the second cross sectional area;
   g) the core material comprises at least one sintered slug or pellet, the slug or pellet having an equivalent density that is at least 55% of the fused density of the metallic oxide superconductor material;
   h) the method further comprises, before the hydrostatic extrusion step, the step of heating the core material to a temperature which, at the commencement of the hydrostatic extrusion step, is at most about 450° C.; and
   i) the cladding material comprises a dispersion hardened metal or a dispersion hardened metal alloy.

2. The method of claim 1, wherein the core material is initially in the form of a powder, and the providing step comprises the step of processing the initial core material powder such that said at least one slug or pellet is produced.

3. The method of claim 2, wherein the step of processing the initial core material comprises the steps of isostatically compressing the initial core powder such that said slug or pellet is produced, and then sintering said slug or pellet.

4. The method of claim 2, further comprising, before the enclosing step, the step of dispersing powdered silver in the initial core material powder.

5. The method of claim 4, wherein the dispersing step comprises the steps of:

i) mixing the initial core material powder with powdered silver oxide;
j) ball milling the mixed powders in a solvent such that a slurry is formed;
k) vacuum filtering the slurry such that a filtrate is recovered;
l) drying the filtrate such that a dry cake is formed; and m) heating the dry cake for at least two hours at a temperature of about 400° C.

6. The method of claim 4, wherein the dispersing step results in core material containing about 28 vol. % of silver.

7. The method of claim 1, wherein the core material comprises at least 70 vol. % metallic oxide superconductive material.

8. The method of claim 1, wherein the metallic oxide superconductive material comprises $Ba_2YCu_3O_7$.

9. The method of claim 1, wherein the heating step comprises heating the core material to a temperature which, at the commencement of the hydrostatic extrusion step, is at least about 316° C.

10. The method of claim 1, wherein the heating step comprises heating the core material to a temperature which, at the commencement of the hydrostatic extrusion step, is at least about 316° C., but not more than about 450° C.

11. The method of claim 1, wherein the cladding material comprises a dispersion of cadmium oxide in silver.

12. The method of claim 11, wherein the content of said cadmium oxide in said cladding material is about 10 mole %.

13. The method of claim 1, wherein the cladding material comprises a dispersion of nickel in silver, and wherein the method further comprises, after the elongating step, the step of removing the cladding material from the composite extrudate.

14. The method of claim 13, wherein the content of said nickel in said cladding material is about 10 mole %.

15. The method of claim 1, wherein the cladding material comprises dispersion strengthened copper, and wherein the method further comprises, after the elongating step, the step of removing the cladding material from the composite extrudate.

* * * * *